(12) United States Patent
Jun

(10) Patent No.: US 6,658,611 B1
(45) Date of Patent: Dec. 2, 2003

(54) PROGRAMMABLE BUILT-IN SELF-TEST SYSTEM FOR SEMICONDUCTOR MEMORY DEVICE

(75) Inventor: Hong-Shin Jun, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/441,625

(22) Filed: Nov. 16, 1999

(30) Foreign Application Priority Data

Nov. 19, 1998 (KR) .............................. 98-49804

(51) Int. Cl.[7] .......................... G01R 31/28; G11C 7/00
(52) U.S. Cl. ....................... 714/719; 365/201
(58) Field of Search ................ 714/719, 718, 714/732–733; 365/201

(56) References Cited

U.S. PATENT DOCUMENTS

| | | | |
|---|---|---|---|
| 4,195,770 A | | 4/1980 | Benton et al. ............... 714/718 |
| 4,974,226 A | | 11/1990 | Fujimori et al. ............. 714/726 |
| 5,138,619 A | | 8/1992 | Fasang et al. ............... 714/718 |
| 5,173,906 A | | 12/1992 | Dreibelbis et al. .......... 714/733 |
| 5,258,986 A | | 11/1993 | Zerbe ......................... 714/719 |
| 5,301,156 A | | 4/1994 | Talley ........................ 714/732 |
| 5,388,104 A | | 2/1995 | Shirotori et al. ............ 714/718 |
| 5,471,482 A | | 11/1995 | Byers et al. ................ 714/719 |
| 5,572,712 A | * | 11/1996 | Jamal ......................... 713/500 |
| 5,633,877 A | | 5/1997 | Shephard, III et al. ..... 714/725 |
| 5,661,732 A | * | 8/1997 | Lo et al. ..................... 714/725 |
| 5,668,817 A | * | 9/1997 | Adham ........................ 714/732 |
| 5,680,543 A | * | 10/1997 | Bhawmik .................... 714/30 |
| 5,737,340 A | * | 4/1998 | Tamarapalli et al. ........ 714/733 |
| 5,784,323 A | * | 7/1998 | Adams et al. .............. 365/201 |
| 5,831,992 A | * | 11/1998 | Wu ............................ 714/732 |
| 5,938,784 A | * | 8/1999 | Kim ........................... 714/733 |
| 6,032,281 A | * | 2/2000 | Fujisaki ..................... 714/738 |
| 6,108,798 A | * | 8/2000 | Heidel et al. ................ 714/30 |

OTHER PUBLICATIONS

Edward J. McCluskey, "Built–in Self–test Techniques" Apr. 1985.

* cited by examiner

Primary Examiner—Albert Decady
Assistant Examiner—Esaw Abraham
(74) Attorney, Agent, or Firm—Marger Johnson & McCollom, P.C.

(57) ABSTRACT

A programmable built-in self-test (BIST) system comprises a parameter register file for storing parameters to test a memory device. The parameters are externally programmed depending upon characteristics of the memory device. The BIST system tests the memory device with optimum test patterns stored in the parameter register file. Thus, the memory device can be tested by the BIST system, flexibly, although the memory device has various reading/writing control methods and their complex timing. Further, the timing characteristics of the memory device can be tested in a developing step of a memory core. Therefore, a memory test efficiency and its error detection efficiency can be increased.

6 Claims, 8 Drawing Sheets

Fig. 6

| Y-March 14N | ↑(RX,W0,R0); | ↑(R0,W1,R1); | ↑(R1,W0,R0); | ↓(R0,W1,R1); | ↓(R1,W0,R0); | ↓(R0,W1,R1); |
|---|---|---|---|---|---|---|
| March element | ↑(RX,W0,R0); | ↑(R0,W1,R1); | ↑(R1,W0,R0); | ↓(R0,W1,R1); | ↓(R1,W0,R0); | ↓(R0,W1,R1); |
| BIST Mode | SETUP \| RUN | SETUP \| RUN | SETUP \| RUN | SETUP \| RUN | SETUP \| RUN | SETUP \| RUN |

Fig. 7

| Parameter | Symbol | Same Bank | Diff. Bank | Unit |
|---|---|---|---|---|
| Row active to Row active delay | tRRD(min) | | 20 | ns |
| RASB to CASB delay | tRCD(min) | 30 | – | ns |
| Row precharge time | tRP(min) | 30 | – | ns |
| Row active time | tRAS(min) | 60 | – | ns |
| | tRAS(max) | 200 | – | μs |
| Row cycle time | tRC(min) | 90 | – | ns |
| Last data in to new col. address delay | tCDL(min) | 10 | 10 | ns |
| Last data in to row precharge | tRDL(min) | 10 | – | ns |
| Col. address to col. address delay | tCCD(min) | 10 | 10 | ns |

PROGRAMMABLE BUILT-IN SELF-TEST SYSTEM FOR SEMICONDUCTOR MEMORY DEVICE

FIELD OF THE INVENTION

The present invention relates to built-in self-test (BIST) for integrated circuits, and more particularly to on-chip techniques for testing semiconductor memories embedded in application specific integrated circuits.

BACKGROUND OF THE INVENTION

Integrated circuit devices such as random access memories (RAMs) typically undergo device verification testing during manufacture. Typically, such verification tests are designed to detect both static and dynamic defects in such a memory array. Such static defects include, for example, open circuit and short circuit defects in the integrated circuit device. Dynamic defects include defects such as weak pull-up or pull-down transistors that create timing sensitive defects in such a memory array.

A specialized integrated circuit device tester is normally employed to perform manufacturing verification tests. For example, such an integrated circuit device tester may be used to perform read/write verification cycle tests on the memory array. Relatively low speed, low cost integrated circuit device testers are usually sufficient for detecting static defects in the memory array. However, extremely expensive integrated testers are needed to detect dynamic defects in very high speed memory arrays. Unfortunately, such expensive high speed integrated circuit testers increase the overall manufacturing costs for such devices. In addition, for integrated circuit devices that provide large memory arrays, the cycle time required to perform such read/write tests increases in proportion to the size of the array.

Attempts to overcome some of the difficulties associated with testing integrated circuit devices have included implementing built-in self-test (BIST) circuitry. Various techniques are described in "Built-In Self-Test Techniques" by Edward J. McCluskey, IEEE Design and Test of Computers, Vol. 2, No. 2, pp. 21–28, April 1985, and U. S. Pat. Nos. 5,633,877; 5,301156; 4,195,770; 4,974,226; 5,138,619; 5,173,906; 5,258,986; 5,388,104; and 5,471,482.

The BIST circuitry is used for testing a digital logic, an analog core, a memory, and so on. In the memory test, BIST methods are classified into a deterministic test method and a randomized test method. Considering test time and fault coverage of the test, the deterministic test method adopting a March test algorithm is more useful than the randomized test method. The March test algorithm is able to be adopted to various kinds of memories, such as a complied synchronous/asynchronous,RAM, an enhanced data output DRAM (EDO DRAM), a synchronous DRAM, a flash memory, and an electrically erasable and programmable ROM (EEPROM).

For example, an integrated circuit cache memory array may contain circuitry to perform a March pattern on the memory array. A state machine is typically used to generate the March pattern along with circuitry to sample data output and to generate a signature of the results. The signature is then compared against an expected value to determine whether defects exist in the memory array. Such BIST circuitry usually enables high speed testing while obviating expensive high speed testers.

Unfortunately, past BIST routines have. only been able to apply a preprogrammed test sequence on the memory array. For example, a compiled SRAM has simple read/write control and its control timing, so that the BIST circuitry can be constructed easily. However, a DRAM has various reading/writing control methods and its complex timing, so that the DRAM can not be tested sufficiently in consideration of all timing parameters by using the fixed test sequence.

SUMMARY OF THE INVENTION

It is therefore an object of the present invention to provide a programmable BIST system for testing a memory device with optimum test patterns depending upon characteristics of the memory device.

It is therefore another object of the present invention to provide a programmable BIST system for increasing a memory test efficiency and its error detection efficiency.

In order to attain the above objects, according to an aspect of the present invention, there is provided a BIST system for a semiconductor memory comprising a parameter register file having a plurality of externally programmable registers for storing parameters to test the memory; a BIST machine for controlling read/write operations of the memory in response to the parameters stored in the parameter register file, and sensing an occurrence of an error according to the read/write operations; and a multi-input signature register (MISR) for compressing test results from the BIST machine.

As is apparent from the foregoing, according to the BIST system of the invention, read/write patterns for testing the memory can be externally programmed, so that the BIST system can test the memory having various reading/writing control methods and its complex timing, with programmed optimum parameters.

According to the programmable BIST system of the invention, the timing characteristics of the memory device can be tested in a developing step of a memory core. Therefore, a memory test efficiency and its error detection efficiency can be increased.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 6 is a diagram for illustrating an example of Y-March 14N;

FIG. 7 is a diagram for illustrating operating characteristics of an SDRAM applied to the embodiment of the present invention;

DESCRIPTION OF THE PREFERRED EMBODIMENT

Figure 1:
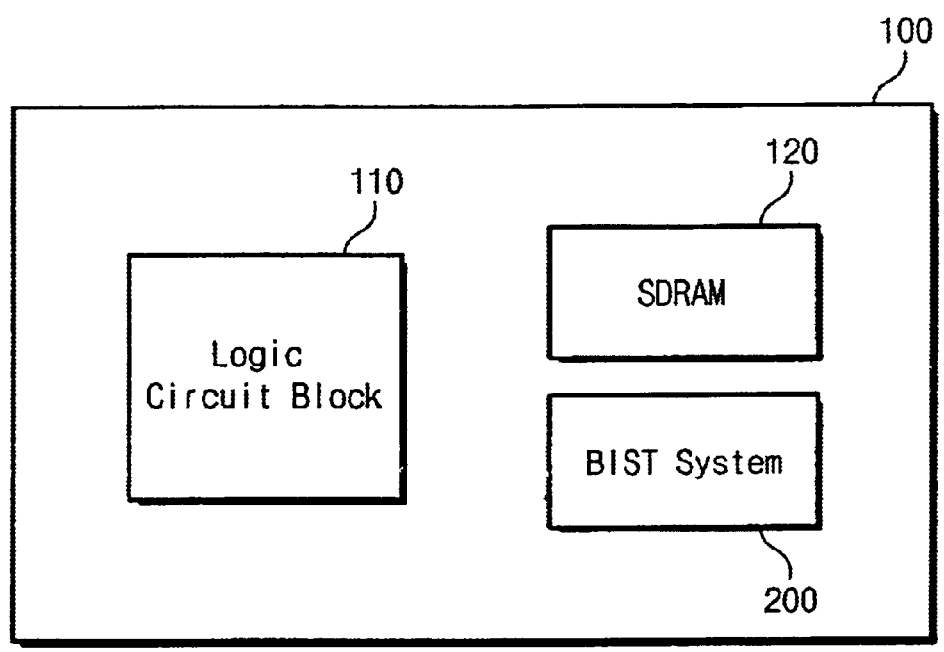
FIG. 1 is a schematic block diagram for illustrating a conventional one chip semiconductor device including a memory device and a BIST system.

FIG. 1 is a schematic block diagram for illustrating a conventional one chip semiconductor device including a memory device and a BIST system. Referring to FIG. 1, the semiconductor device 100 comprises a logic-circuit block 110, an SDRAM 120 as the memory device, and the BIST system 200. For example, if the semiconductor device 100 is an application-specific integrated circuit (ASIC), the logic circuit block 110 is a principal circuit block for performing applicable functions. The logic circuit block 110 and the SDRAM 120 performs normal operations in a normal mode of the semiconductor device 100, and logic circuit block 110 performs test operations for the SDRAM 120 in a test mode of the semiconductor device 100.

Figure 2:
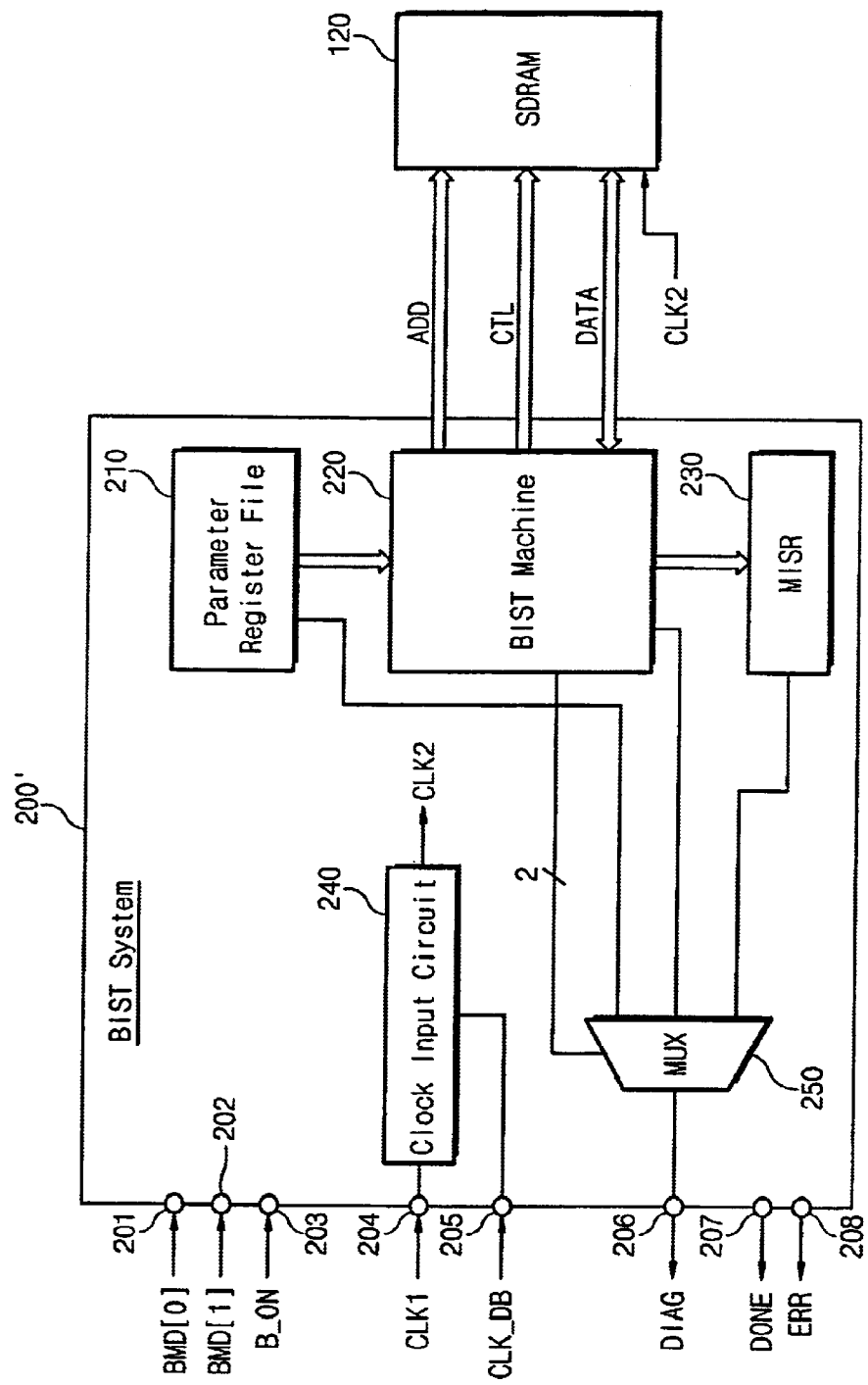
FIG. 2 is a block diagram for illustrating a BIST system according to a preferred embodiment of the present invention.

FIG. 2 is a block diagram for illustrating a novel BIST system 200' according to a preferred embodiment of the present invention. Referring to FIG. 2, the BIST system 200' comprises a parameter register file 210, a BIST machine 220, a multi-input signature register (MISR) 230, a clock input circuit 240, and a multiplexer 250. It will be appreciated that novel BIST system 200', while similar in purpose to prior art BIST system 200, is different in important ways therefrom.

The parameter register file 210 is an externally programmable register, which stores parameters for testing the SDRAM 120. Register file 210 is a register that is programmable by a circuit (not shown) external to BIST System 200', as is well known. Thus, the external programming circuit will not be described in further detail. The BIST machine 220 outputs row/column address signals (ADD) and control signals (CTL) into the SDRAM 120 in the test operation using the parameters stored in the parameter register file 210, and inputs and outputs data signals (DATA) corresponding to the read/write operations of the SDRAM 120. The MISR 230 compresses test results from the BIST machine 220 and then outputs them, wherein a compression manner of the MISR 230 is well known already. Thus, more detailed description related to the compression manner is omitted. In addition, more concrete configuration and operation of the invention will be described in detail later. The remaining input/output signals shown in FIG. 2 will be described below.

Figure 3:
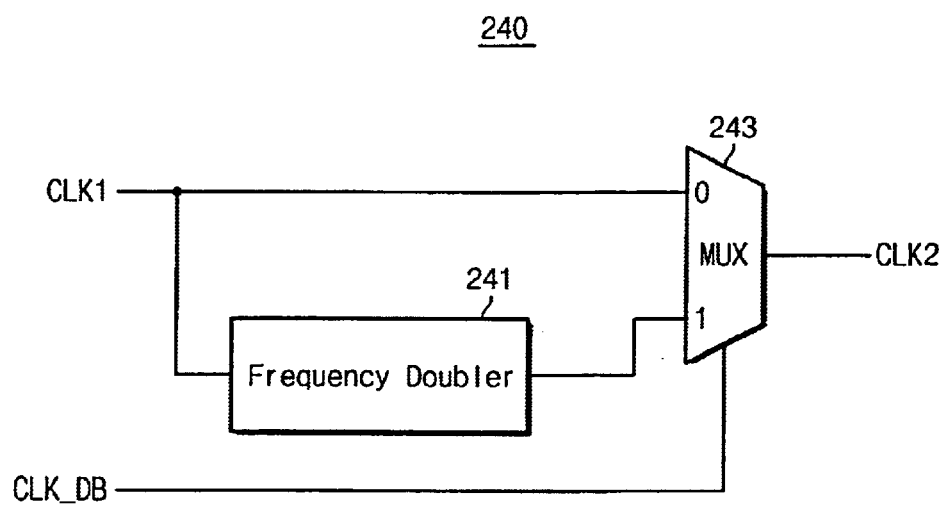
FIG. 3 is a diagram for illustrating the clock input circuit shown in FIG. 2.

FIG. 3 is a diagram for illustrating the clock input circuit 240 shown in FIG. 2. Referring to FIG. 3, the clock input circuit 240 comprises a frequency doubler 241 and a multiplexer 243. The frequency doubler 241 receives a first clock signal CLK1 having a first frequency, and outputs a doubled clock signal into the multiplexer 243 after frequency doubling. The multiplexer 243 outputs either the externally loaded first clock signal CLK1 or the doubled clock signal from the frequency doubler 241 in response to a doubling selection signal CLK_DB, as a second clock signal CLK2. When the doubling selection signal CLK_DB is logic low ("0"), the clock input circuit 240 provides the first clock signal CLK1 for the BIST system 200' and the SDRAM 120 without frequency doubling, as the second clock signal CLK2. Thus, the second clock signal CLK2 has the first frequency. When the doubling selection signal CLK_DB is logic high ("1"), the clock input circuit 240 provides the doubled clock signal for the BIST system 200 and the SDRAM 120, as the second clock signal CLK2. In that case, the second clock signal CLK2 has a second frequency which is double of the first frequency. Therefore, the BIST system 200' according to the present invention can test the SDRAM 120 with two different frequencies, such as the first frequency and the second frequency.

For example, according to the present invention, the SDRAM 120 is able to be tested by a 50 MHz-low cost test equipment with 100 MHz clock speed. When the first clock signal CLK1 is inputted with 50 MHz clock speed, the frequency doubler 241 generates the doubled clock signal having 100 MHz clock speed by frequency doubling. In that case, if the clock doubling selection signal CLK_DB is logic high ("1"), the doubled clock signal is provided for the BIST system 200 and the SDRAM 120 as the second clock signal CLK2 with 100 MHz clock speed. Thus, the SDRAM 120 can be tested by the 50 MHz-low cost test equipment with 100 MHz clock speed.

Figure 4:
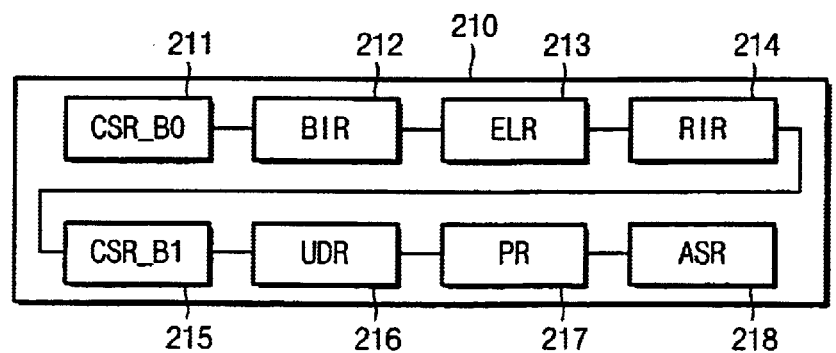
FIG. 4 is a diagram for illustrating the parameter register file shown in FIG. 2.

FIG. 4 is a diagram for illustrating the parameter register file shown in FIG. 2. Referring to FIG. 4, the parameter register file 21,0 is composed of a first command register CSR_B0 211, a second command register CSR_B1 215, a bank interleaving register BIR 212, an error location register ELR 213, a refresh interval register RIR 214, an up/down select register UDR 216, a pattern register PR 217, and an address scanning register ASR 218.

The parameter register file 210 stores parameters for performing March elements to test the SDRAM 120. Since the SDRAM 120 has two memory banks, the parameter register file 210 has two command registers CSR_B0 211 and CSR_B1 215, so as to perform a bank interleaving operation for the respective memory banks.

As described above, the command registers CSR_B0 211 and CSR_B1 215 stores sixteen total commands, respectively, to test the two memory banks included in the SDRAM 120, respectively. Therefore, sixteen commands to be inputted to the SDRAM 120 in synchronism with sixteen clocks are stored in the command registers CSR_B0 211 and CSR_B1 215. Each command is composed of three bits corresponding to control signals CASB, RASB and WEB, which will be described in detail later.

The bank interleaving register BIR 212 is an one-bit register for setting up whether the bank interleaving operation is performed in the test or not. For example, when the bank interleaving register BIR 212 is set to logic high ("1"), the bank interleaving operation is applied to the test. When the bank interleaving register BIR 212 is set to logic low ("0"), the bank interleaving operation is not performed in the test. In that case, thirty-two commands to be inputted to the SDRAM 120 in synchronism with thirty-two clocks, are stored in the command registers CSR_B0 211 and CSR_B1 215 by connecting the registers CSR_B0 211 and CSR_B1 215.

The error location register ELR 213 is an one-bit register for setting up whether an error location function is performed in the test or not. For example, if the location register ELR 213 is set to logic low ("0"), the error location function is not performed. And, if the location register ELR 213 is set to logic high ("1"), the error location function is executed, so that an address and an error bit information are outputted when any error is detected during the test. After outputting an error information such as the address and the error bit information, the test related to the next address is performed continuously.

The refresh interval register RIR 214 is used for setting up a loading interval of an auto-refresh command (i.e., the interval corresponds to the number of clocks for loading the auto-refresh command). Especially, when the SDRAM 120 is tested by changing the setting state of the register RIR 214, the characteristic of the SDRAM 120 can be verified.

The up/down register UDR 216 is a one-bit register for setting up an address scanning direction in the test operation. In other words, the up/down register UDR 216 determines whether the test is to occur starting at a lowest address in the SDRAM 120 and proceeding to a highest address in the SDRAM 120, or the test is to occur starting at a highest address in the SDRAM 120 and proceeding to a lowest address in the SDRAM 120.

The pattern register PR 217 is a two-bit register for specifying a data background to write March elements. For example, the data background is selected out from 0h, 5h, Ah, and Fh (where h means hexadecimal).

The address scanning register ASR-218 is a two-bit register for determining an address scanning method for the test. For example, if the address scanning register ASR 218 is set to "00", the whole addresses are scanned. If the register ASR 218 is set to "01", odd addresses are scanned, and if the register ASR 218 is set to "10", even addresses are scanned.

As shown in FIG. 4, the registers composed in the parameter register file 210 form a scan chain by connecting themselves in series. In a scan mode for testing the BIST system 200 itself, the parameter register file 210 is operated as a scan chain, which will be described in detail later.

Figure 5:
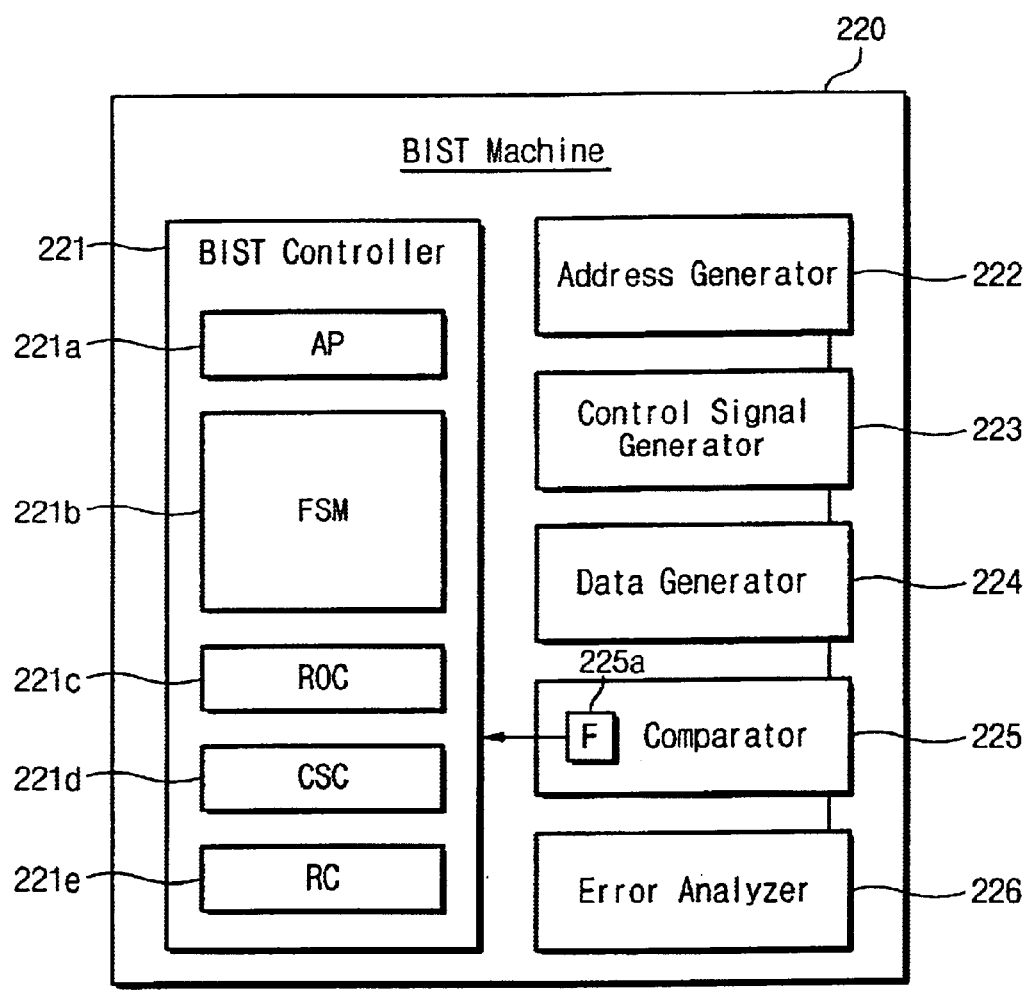
FIG. 5 is a diagram for illustrating the BIST machine shown in FIG. 2.

FIG. 5 is a diagram for illustrating the BIST; machine 220 shown in FIG. 2. Referring to FIG. 5, the BIST machine 220 comprises a BIST controller 221, an address generator 222, a control signal generator 223, a data generator 224, a comparator 225, and an error analyzer 226. The BIST controller 221 includes an address pointer AP 221a, a finite state machine FSM 221b, a read operation counter ROC 221c, a command sequence counter CSC 221d, and a refresh counter RC 221e.

The BIST controller 221 controls overall operations of the BIST system 200', in response to the parameters stored in the parameter register file 210. According to the controls of the BIST controller 221, the test for the SDRAM 120 is executed. The operations of the BIST machine 220 performed in the test are described as follows.

The address generator 222 generates row/column addresses for read/write operation of the SDRAM 120. The control signal generator 223 generates a plurality of control signals, such as RASB, CASB and WEB so as to control the SDRAM 120, and enables the comparator 225 in the read operation so as to execute comparing operation by decoding commands stored in the first and the second command sequence registers CSR_B0 211 and CSR_B1 215. The data generator 224 generates data to be written to the SDRAM 120. The comparator 225 compares an input data of the SDRAM 120 with a reading data which is read from the SDRAM 120 after writing, and sets up an error flag 225a for indicating error detection state if and when an error is detected. The state of the error flag 225a is detected by the BIST controller 221. When the error location register 213 is set to "1", if the error flag 255a is set to "1", the BIST controller 221 stops its test operation and makes the error analyzer 226 operate. The error analyzer 226 outputs an address where the error occurred and an error bit information. After completing this operation, the test related to the next address is performed continuously.

In the first and the second command sequence registers CSR_B0 211 and CSR_B1 215, commands (corresponding to the control signals RASB, CASB, and WEB) to be inputted to the SDRAM 120 in synchronism with the clock signal are stored. In a run mode for testing the SDRAM 120, the BIST controller 211 provides proper commands for the control signal generator 223 by increasing the command sequence counter CSC 221d while the whole address space is scanned.

The address generator 222, the control signal generator 223, the data generator 224, the comparator 225 and the error analyzer 226, included in the BIST machine 220 are connected in series. They operates as a scan chain such as the parameter register file 210 in the scan mode, which will be described in detail later. This series connection is illustrated in FIG. 5 by lines extending between the blocks.

External input/output terminals and operation modes of the BIST system 200' are described as follows. As shown in FIG. 2, the BIST system 200' includes eight input/output terminals. Terminals 201 and 202 are used for setting up the operation mode of the BIST system 200'. Table 1 describes operation modes of the BIST system 200 set by a mode setting signal BMD[1:0] from the terminals 201 and 202.

TABLE 1

| BMD[1:0] | [00] | [01] | [10] | [11] |
|---|---|---|---|---|
| MODE | SIMPLE | SETUP | RUN | SCAN |

As shown in the Table 1, the operation mode of the BIST system 200' is selected among the four operation modes including the simple mode, the setup mode, the run mode and the scan mode, in response to the mode setting signal BMD[1:0].

Terminal 203 is used for inputting a test operation control signal B_ON, terminal 206 is used for outputting a test result signal DIAG. The terminals 203 and 206 are used for performing specific functions in control of and response to the operation mode of the BIST system 200. Terminal 204 is used for receiving the first clock signal CLK1, and terminal 205 is used for receiving the clock doubling selection signal CLK_DB. Terminal 207 is used for outputting a test completion signal DONE, and terminal 208 is used for outputting an error indicating signal ERR.

As described above, the BIST system 200' has four operation modes. If the test operation control signal B_ON is changed from "0" to "1" in the simple mode, the BIST system 200 is operated so as to test the SDRAM 120 by a Y-March 14N pattern. When the test is completed, the test completion signal DONE is changed from "0" to "1". In that case, it can be verified whether the error exists in the SDRAM 120 or not, by checking the error indicating signal ERR. The MISR 230 outputs the test result signal DIAG into the terminal 206 by compressing test results from the BIST machine 220, wherein the test results are obtained by test operation in the simple mode of the BIST machine 220. At this time, the BIST machine 220 controls the multiplexer 250 so as to construct a path between the terminal 206 and the MISR 230. In an environment unable to use an automatic test equipment, scan vectors for the BIST system 200' cannot be loaded. Thus, in that case, the BIST system 200' must be operated in the simple mode, so as to test the SDRAM 120.

The scan mode is an operation mode for testing the BIST system 200' through the scan chain composed of the address generator 222, the control signal generator 223, the data generator 224, the comparator 225 and the error analyzer 226 included in the BIST machine 220, and the parameter register file 210. In the scan mode, the terminal 203 for inputting the test operation control signal B_ON is used for inputting a scan input data, and the terminal 206 for outputting the test result signal DIAG is used for outputting a scan output data. In a scan output operation for outputting the scan output data, the path of the multiplexer 250 is controlled by the BIST machine 220.

The setup mode is an operation mode for setting up the parameters for testing the SDRAM 120. The parameters are loaded: into the parameter register file 210 through the terminal 203 for receiving the test operation control signal B_ON.

The run mode is an operation mode for performing the SDRAM test by the BIST system 200'. The BIST machine 220 tests the SDRAM 120 in the run mode by the parameters set in the parameter register file 210.

FIG. 6 is a diagram for illustrating an example of Y-March 14N. Referring to FIG. 6, the Y-March 14N is composed of six March elements. Each March element requires one execution of the setup mode and the run mode. Thus, for performing the Y-March 14N composed of six March elements, the setup mode and the run mode must be executed six times.

Figure 8:
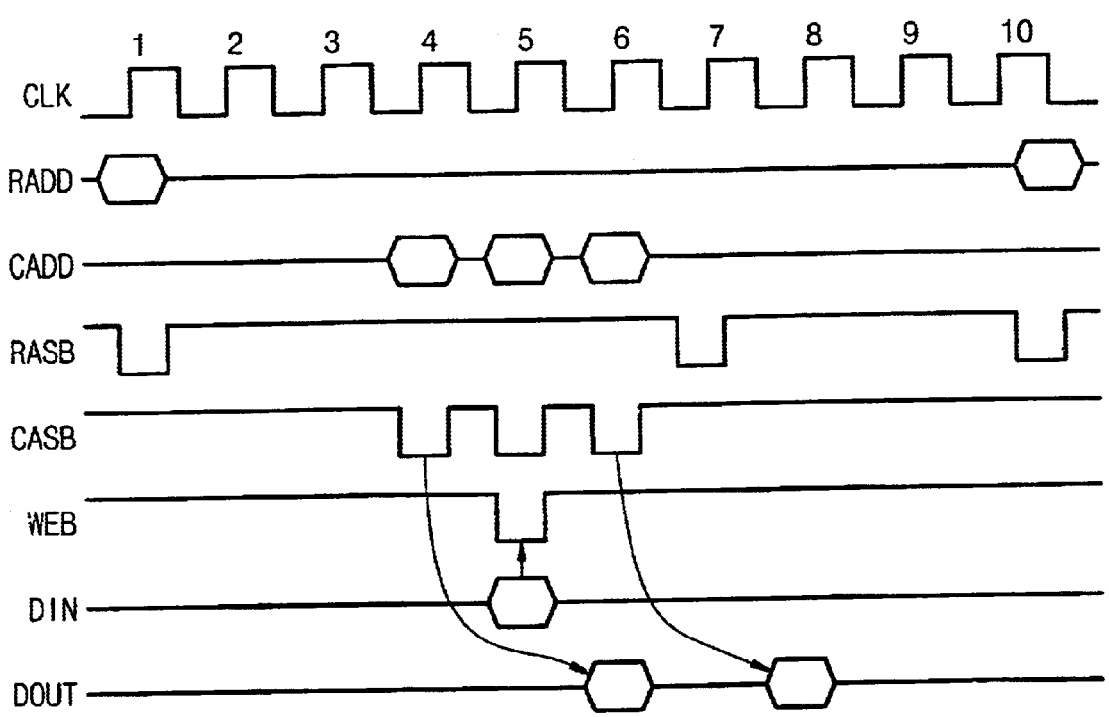
FIG. 8 is a timing diagram for illustrating a read/write/read operation for performing the Y-March 14N shown in FIG. 6.
Figure 9:
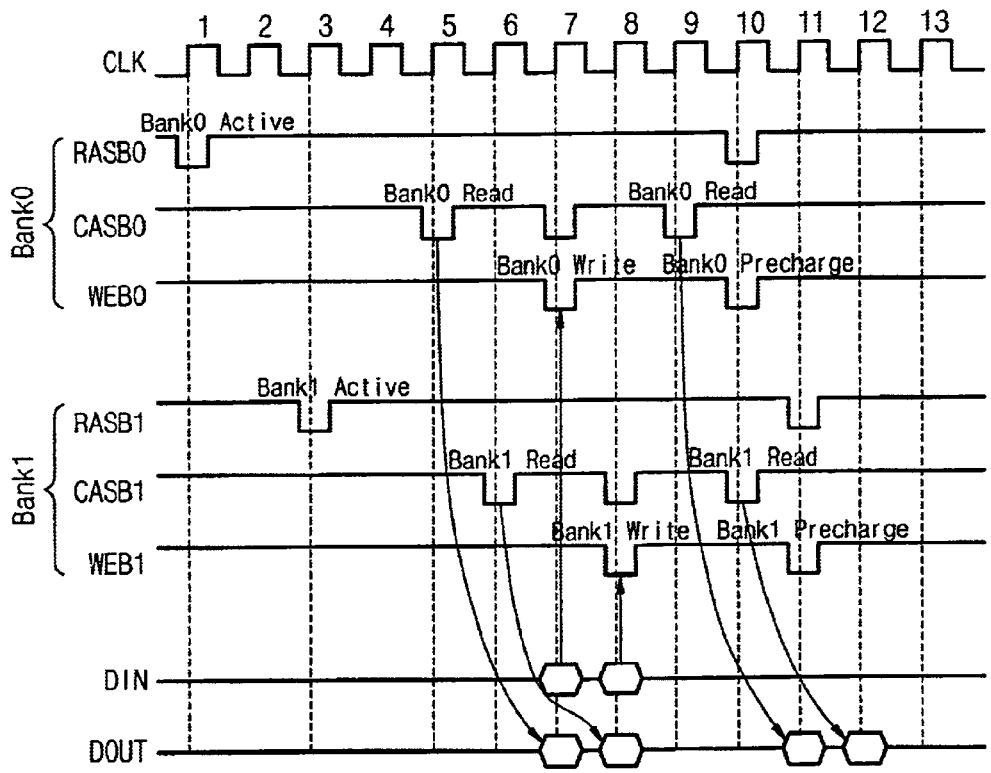
FIG. 9 is a timing diagram for illustrating an example of a bank interleaving operation of the BIST system according to the present invention.
Figure 9:
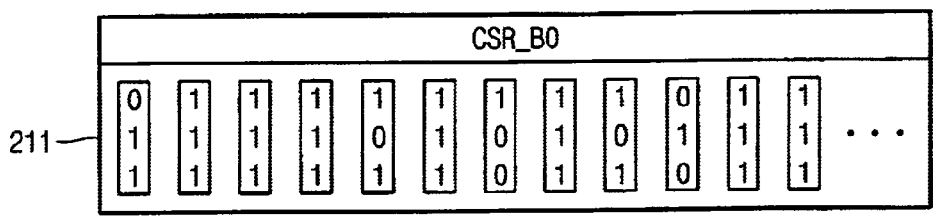
Figure 9:
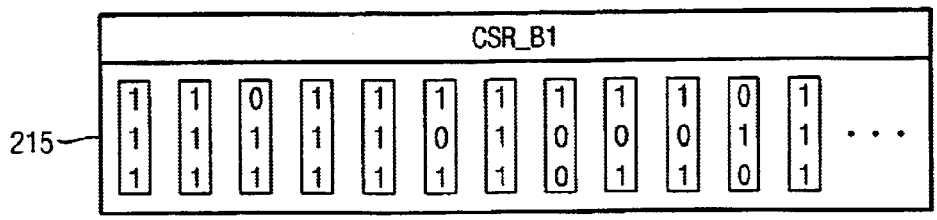

FIG. 7 is a diagram for illustrating operating characteristics of the SDRAM 120 applied to the embodiment of the present invention, FIG. 8 is a timing diagram for illustrating a read/write/read operation for performing the Y-March 14N shown in FIG. 6, and FIG. 9 is a timing diagram for illustrating an example of a bank interleaving operation of the BIST system 200' according to the present invention. FIG. 9 also shows CSR_B0 211 and CSR_B1 215 register contents. Referring to FIG. 6 through FIG. 9, read/write/read operation for performing the Y-March 14N and the bank interleaving operation are illustrated as follows.

The SDRAM 120 according to the present invention has separate row and column addresses, and separate data input and output. The SDRAM 120 is able to execute the bank interleaving operation by receiving separate control signals corresponding to the respective memory banks. Such operation characteristics of the SDRAM 120 are illustrated in FIG. 7. The read/write/read operation timing for performing the Y-March 14N, while satisfying the characteristics of FIG. 7, is illustrated in FIG. 8.

Referring to FIG. 8, a row address RADD is inputted to the SDRAM 120 with the row address strobe signal RASB at a first clock (CLK) cycle. After 30 ns of tRCD, the column address CADD is inputted to the SDRAM 120 with the column address strobe signal CASB at a fourth clock (CLK) cycle. This time, the low-active write enable signal WEB is logic high, so that a read command is inputted to the SDRAM 120. By the read command, a first read data DOUT is outputted two clock (CLK),cycles after inputting the control signal CASB. This delay is shown in FIG. 8 at a sixth clock (CLK) cycle.

In addition, 10 ns of tCCD later after inputting the read command, the column address CADD and a write command is inputted to the SRAM 120 at a fifth clock (CLK) cycle. This time, the low-active write enable signal WEB is logic low, so that an input data DIN is written to a relevant address. Two clocks later after inputting the read command at the sixth clock (CLK) cycle, a second output data DOUT is outputted from the SDRAM 120 at an eighth clock (CLK) cycle. And then, 30 ns of a row precharge time tRP later, the control signal RASB is inputted to the SDRAM 120, so that the next row address is inputted. According to above described method, the read/write/read operation for one address can be performed within nine clock (CLK) cycles.

Referring next to FIG. 9, the bank interleaving operation is performed with successive execution of the commands (corresponding to the control signals RASB, CASB and WEB) stored in the first and the second command sequence registers CSR_B0 211 and CSR_B1 215. The read/write/read operations for the two memory banks of the SDRAM 120 are performed, respectively. The BIST controller 221 supplies the command from the command sequence registers CSR_B0 211 and CSR_B1 215 to the control signal generator 223 while increasing the command sequence counter CSC 221d to scan the whole address space in the run mode.

As described above, the programmable BIST system 200' according to the present invention can test a memory device with optimum test patterns depending upon the characteristics of the memory device. Thus, the BIST system 200' can test the memory device, flexibly, by considering the various reading/writing control methods and their complex timing. Further, the timing characteristics of the memory device can be tested in a developing step of a memory core. Therefore, a memory test efficiency and its error detection efficiency can be increased.

While the invention has been described in terms of an exemplary embodiment, it is contemplated that it may be practiced as, outlined above with modifications within the spirit and scope of the appended claims.

What is claimed is:

1. A built-in self-test (BIST) system for a semiconductor memory, comprising:

a parameter register file having a plurality of externally programmable registers, for storing parameters to test the memory;

a BIST machine for controlling read/write operations of the memory in response to the parameters stored in the parameter register file, sensing an occurrence of an error according to the read/write operations and producing error test results in the form of one or more signatures;

a multi-input signature register (MISR) for compressing test results from the BIST machine; and a clock input circuit for receiving a first clock signal having a first frequency and for receiving a clock doubling selection signal, and for outputting a second clock signal to the BIST system and the memory so as to test the memory, wherein the second clock signal has the first frequency when the clock doubling selection signal has a first value, and the second clock signal has a second frequency as a double of the first frequency, when the clock doubling selection signal has a second value.

2. The BIST system of claim 1, wherein the parameter register file comprises:

a command sequence register for storing a plurality of commands to test the memory;

a bank interleaving register for setting up whether or not a bank interleaving operation is applied to the memory test;

an up/down register for setting up an address scanning direction in the memory test; an error location register for setting up whether or not an error location function to output an error information is performed in the memory test;

a pattern register for specifying a data background to write test data;

a refresh interval register for setting up a refresh interval of the memory; and an address scanning register for determining an address scanning method for the memory test.

3. The BIST system of claim 2, wherein the BIST machine comprises:
- a BIST controller for controlling overall operations of the BIST system so as to test the memory, in response to the parameters stored in the parameter register file;
- a data generator for generating data to be written to the memory;
- an address generator for generating read/write addresses of the memory;
- a control signal generator for generating a plurality of control signals to control the read/write operations of the memory;
- a comparator for comparing the data written in the memory with the data read from an address region corresponding to the written data so as to detect the error; and
- an error analyzer for outputting an address corresponding to the detected error and an error bit information when the error is detected by the comparator.

4. The BIST system of claim 3, wherein the plural registers included in the parameter register file are connected in series to compose a first scan chain, and the data generator, address generator, the control signal generator, the comparator and the error analyzer are coupled in series to compose a second scan chain,
- wherein the first scan chain and the second scan chain compose a third scan chain by coupling with each other.

5. The BIST system of claim 4, which further comprises:
- a simple mode for testing the whole memory area, and outputting test results compressed by the MISR;
- a setup mode for loading the parameters into the parameter register file from a source external to the memory;
- a run mode for testing the memory by the parameters from the parameter register file; and
- a scan mode for testing the BIST system itself.

6. The BIST system of claim 5, which further comprises a multiplexer for outputting at least one of test results from the BIST machine, the MISR, or the parameter register file, selectively.

* * * * *

UNITED STATES PATENT AND TRADEMARK OFFICE
CERTIFICATE OF CORRECTION

PATENT NO.    : 6,658,611 B1
DATED         : December 2, 2003
INVENTOR(S)   : Jun It is certified that error appears in the above-identified patent and that said Letters Patent is hereby corrected as shown below:

Column 1,
Line 52, "synchronous/asynchronous, RAM," should read -- synchronous/asynchronous RAM, --.

Column 3,
Line 10, "a logic-circuit block" should read -- a logic circuit block --.

Column 4,
Line 20, "file 21,0 is" should read -- file 210 is --.

Column 5,
Line 16, "register ASR-218 is" should read -- register ASR 218 is --.
Line 27, "the BIST; machine" should read -- the BIST machine --.

Column 7,
Line 7, "loaded: into the" should read -- loaded into the --.
Line 50, "clock (CLK),cycles" should read -- clock (CLK) cycles --.

Column 10,
Line 8, "system of claim 4," should read -- system of claim 3, --

Signed and Sealed this

Eleventh Day of May, 2004

JON W. DUDAS
*Acting Director of the United States Patent and Trademark Office*